United States Patent [19]

Belke et al.

[11] Patent Number: 4,876,120

[45] Date of Patent: Oct. 24, 1989

[54] TAILORABLE MULTI-LAYER PRINTED WIRING BOARDS OF CONTROLLED COEFFICIENT OF THERMAL EXPANSION

[75] Inventors: Robert E. Belke, Clay; Louis Zakraysek, Cicero; Walter O. Pillar, New Hartford, all of N.Y.

[73] Assignee: General Electric Company, Coshocton, Ohio

[21] Appl. No.: 40,981

[22] Filed: Apr. 21, 1987

[51] Int. Cl.$^4$ ............ C09K 19/00; B32B 15/04; H01B 5/00; H05K 1/00

[52] U.S. Cl. .................. 428/1; 174/68.5; 174/106 R; 174/126.1; 174/126.2; 361/380; 361/397; 361/117; 428/196; 428/206; 428/209; 428/240; 428/246; 428/252; 428/288; 428/295; 428/292; 428/457; 428/458; 428/473.5; 428/901

[58] Field of Search ......... 428/209, 1, 458, 473.5, 428/901, 196, 206, 240, 246, 252, 288, 295, 292, 457, 901; 174/68.5, 65.5, 106 R, 126.1, 126.2; 361/397, 417, 380

[56] References Cited

U.S. PATENT DOCUMENTS

| | | | |
|---|---|---|---|
| 4,225,700 | 9/1980 | Wolfe et al. | 528/337 |
| 4,533,692 | 8/1985 | Wolfe et al. | 524/417 |
| 4,533,693 | 8/1985 | Wolfe et al. | 524/417 |
| 4,533,724 | 8/1985 | Wolfe et al. | 528/313 |
| 4,554,119 | 11/1985 | Chenevey | 264/85 |
| 4,606,875 | 8/1986 | Chenevey et al. | 264/85 |
| 4,675,246 | 6/1987 | Kundinger et al. | 428/473.5 |
| 4,680,244 | 7/1987 | Lehmann et al. | 430/49 |

OTHER PUBLICATIONS

Macromolecules, 1981, 14, 909 et. seq., American chemical Society.
Polymer Preprints, 28, No. 1, 50 (Apr., 1987).

Primary Examiner—Teddy S. Gron
Attorney, Agent, or Firm—Mueller and Smith

[57] ABSTRACT

Disclosed are improved laminates useful in the manufacture of multi-layer printed wiring boards (MLPWB) and laminates. Such improved composites contain at least one layer which is formed from a liquid crystal polymer selected from the group consisting of poly(-para-phenylene benzobisthiazole), poly(paraphenylene benzobisoxazole), poly(2,5-benzothiazole), poly(2,5-benzoxazole), and mixtures thereof. The presently preferred liquid crystal polymer comprises poly(para-phenylene benzobisthiazole). The negative coefficient of thermal expansion and high modulus of elasticity of the liquid crystal polymers enable a laminate and MLPWB to be manufactured therefrom having a tailored coefficient of thermal expansion, broadly ranging from about 0 to 15 ppm/° C. MLPWBs constructed of polymeric core layers also are possible utilizing the preferred liquid crystal polymers of the present invention.

27 Claims, 2 Drawing Sheets

TAILORABLE MULTI-LAYER PRINTED WIRING BOARDS OF CONTROLLED COEFFICIENT OF THERMAL EXPANSION

BACKGROUND OF THE INVENTION

The Government has rights in this invention under USAF contract F33615-84-C-5023. The present invention relates to multi-layer printed wiring boards (MLPWB) and more particularly to the manufacture of printed wiring boards (PWB) of controlled in-plane coefficient of thermal expansion (CTE).

In recent years, there has been an accelerating trend towards simultaneous circuit size reduction and expansion of function in high performance electronic systems. PWB technology has played an integral role in this evolution. Surface mount technology (SMT) has introduced new requirements in the design of PWBs, such as the use of substrates with fine lines and close spacing, small diameter plated through holes (PTH) and vias, and chip carriers with large numbers of fillet solder joints.

The evolution of PWB laminates (often composed of multiple thin laminates or "thin lams") has been prompted by greater device complexity as well as the need to package these devices in a smaller volume. Maximum circuit integrity under adverse conditions also is a design criterion. Selection of materials which exhibit desirable characteristics is one method for improving PWB performance. Both the resin system or matrix as well as the reinforcing material need to be tailored, as does their combination, in order for PWBs to continue to keep pace with chip development, for example. Resin systems, for example, generally are found to require a compromise from among properties such as low bulk CTE, low dielectric constant ($E_r$), high thermal stability, high glass transition temperature ($T_g$), and ease of processing. The point in time is fast approaching where the current commercially available PWB materials possess insufficient mechanical, physical, and electrical characteristics to meet growing packaging demands.

The foregoing requirements, perhaps, can be better appreciated when it is realized that conventional (and future) ceramic chip carrier materials require an in-plane CTE as low as 0 ppm/°C. and as high as 15 ppm/°C. (ppm, for present purposes, represents $10^{-6}$). In-plane CTE values in this range also will facilitate future implementation of direct die-to-bond attachment. The CTE values of silicon, GaAs, and many other ceramic materials fall within this range. A close Z-axial composite expansion match to copper (17 ppm/°C.) also is important to reduce stress in PTHs. Reduced dielectric constant (say, under 3.0 at 1 KHz) becomes increasingly desirable at high device clock rates since this minimizes propagation delay. A high temperature resin $T_g$ (say, above 185° C.) assures that the MLPWB expansion will remain relatively low and linear as a function of temperature during thermal excursions. Low composite moisture absorption (say, under 0.5% at saturation) assures electrical property stability, as well as low matrix swelling, during environmental humidity shifts. The development of new or improved materials of construction for PWBs must be tempered with the ability to advantageously utilize existing manufacturing technology (e.g. treating, B-staging, lamination, etc.), while taking advantage of non-traditional technologies, e.g. paper making or co-extrusion.

Additional problems requiring addressing include LCCC (leadless ceramic chip carrier) solder joint thermal fatigue and plated whole barrel cracking. Thus, it will be observed that a formidable task confronts the designer and manufacturer of laminates and PWBs.

BROAD STATEMENT OF THE INVENTION

In its broadest aspects, the present invention is directed to improved composites, such as MLPWBs and laminates, for use in the manufacture of PWBs. The improved MLPWBs and laminates contain at least one layer which is formed from a liquid crystal polymer selected from the group consisting of poly(para-phenylene benzobisthiazole), poly(para-phenylene benzobisoxazole), poly(2,5-benzothiazole), poly(2,5-benzoxazole), and mixtures thereof. The preferred liquid crystal polymer comprises poly(para-phenylene benzobisthiazole). The liquid crystal polymer can be supplied in the form of yarn, short fibers, pulp, paper film, platelets, molecular composites, fabric, non-woven mat, or a continuous film. The negative coefficient of thermal expansion and high Young's modulus of the preferred liquid crystal polymers enable a laminate and MLPWBs manufactured therefrom to have a precisely controlled coefficient of thermal expansion, for example, broadly ranging from about 0 to 15 ppm/°C. and advantageously 3 to 7 ppm/°C..

The method for controlling the in-plane coefficient of thermal expansion of MLPWBs comprises yet another aspect of the present invention. The use of polymeric core layers also is possible utilizing the preferred liquid crystal polymers of the present invention. Combining such liquid crystal polymers with other conventional reinforcement materials provides flexibility in MLPWB design and laminate design which heretofore was not possible.

Advantages of the present invention include the ability to control the in-plane coefficient of thermal expansion of MLPWBs without adversely effecting Z-direction expansion or sacrificing the other properties thereof. Another advantage is the ability to replace conventional metal core layers with layers formed from the liquid crystal polymer materials disclosed herein. Yet another advantage is the ability to utilize conventional PWB processing techniques utilizing the unique liquid crystal polymers disclosed herein. These and other advantages will be readily apparent to those skilled in the art based upon the disclosure contained herein.

Figure 1:
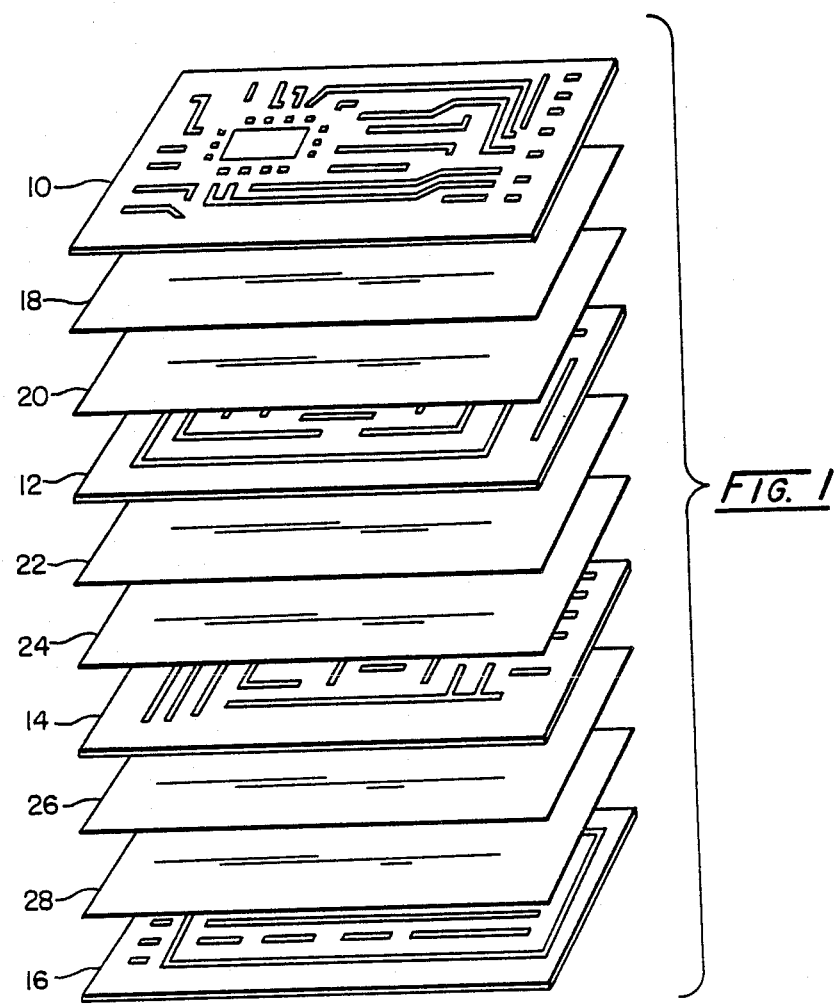
FIG. 1 is a perspective view showing the construction of an MLPWB.

The drawings will be described in detail in connection with the following description of the invention.

DETAILED DESCRIPTION OF THE INVENTION

The ability to control the in-plane CTE of single or multi-layer PWBs over a temperature range of, for example, −65° to +125° C. for populated boards, is made possible by use of reinforcement materials which express a negative CTE and a very high axial modulus of elasticity of greater than 40,000,000 psi. Equations developed by Halpin and Pagano, AFML TR68-395, illustrate the relationship between the resin matrix and reinforcement fiber in governing the CTE of the composite. The less complex equation for CTE of uni-directional composites in the fiber direction, for example, shows the effect of the constituents:

$$\alpha_{11} = \frac{E_f \alpha_f V_f + E_m \alpha_m V_m}{E_f V_f + E_m V_m}$$

α = CTE
E = Modulus
V = Volume Fraction
f,m = Fiber, Matrix
ll = Direction parallel to fibers Thus, the CTE of the composite is directly affected by the modulus as well as the CTE of the reinforcement fiber.

Highly ordered polymers possessing such characteristics can be used in a variety of physical forms in combination with other materials to provide precise in-plane CTEs of PWBs. Anisotropic polymers or liquid crystal polymers possessing the requisite characteristics noted above and which are preferred for use in the present invention include poly(para-phenylene benzobisthiazole) of Structure I (both cis and trans forms), poly(para-phenylene benzobisoxazole) of Structure II (both cis and trans forms), poly(2,5-benzothiazole) of Structure III, and poly(2,5-benzoxazole) of Structure IV. The repeating units of these structures of these liquid crystal polymers and the abbreviations which will be used herein are set forth below:

(I) PBZT (or PBT, trans form shown)

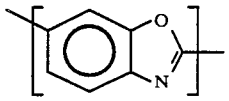

(II) PBO (trans form shown)

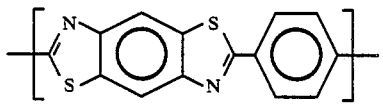

(III) ABPBZT

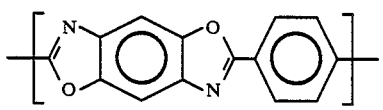

(IV) ABPBO

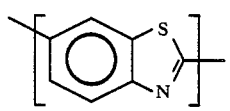

Note that the designation PBT may be found in the literature for Structure I (and Structure III). The compounds are the same. The synthesis of the foregoing liquid crystal polymers and their conversion to fibrous form can be found in the following references: U.S. Pat. Nos. 4,225,700; 4,606,875; 4,487,735; 4,533,724; 4,545,119; 4,533,692; and 4,533,693; *Macromolecules*, 1981, 14, 909 et seq., and *Polymer Preprints*, 28, No. 1, 50 (April, 1987), the disclosure of which is expressly incorporated herein by reference.

Much of the description herein will refer to PBZT as it has been the most characterized of the preferred liquid crystal polymers. Such description is by way of illustration and not by way of limitation. Fibers and films manufactured from PBZT possess unique characteristics, some of which are equivalent to and some of which are superior to fibers and films manufactured from materials which are conventionally used in reinforcing PWBs. The following tables set forth the characteristics of fibers and films manufactured from PBZT and from some conventional materials:

| COMPARATIVE PBZT FIBER PROPERTIES | | | |
|---|---|---|---|
| | PBZT | Kevlar 49*** | Quartz |
| Axial Young's Modulus, X10⁶ PSI | 40–70* | 18.5 | 10 |
| Trans. Young's Modulus, X10⁶ PSI | 1.4** | 1.4 | 10 |
| Axial Poisson's Ratio | 0.3 | 0.3 | 0.2 |
| Transverse Poisson's Ratio | 0.3 | 0.3 | 0.2 |
| Axial Shear Modulus, X10⁶ PSI | 0.28** | 0.28 | 4.27 |
| Axial CTE, PPM/°C. | −4.0** | −4.0 | 0.54 |
| Transverse CTE, PPM/°C. | 59.0** | 59.0 | 0.54 |

\* = Value dependent on heat treatment and processing
\*\* = Estimated Values
\*\*\* = Kevlar brand poly-p-phenylene terephthalamide, E. I. duPont de Nemours and Company.

| COMPARATIVE PBZT FILM PROPERTIES | | | |
|---|---|---|---|
| | PBZT Film | Kapton Film* | Mylar Film** |
| Ultimate Tensile Strength (PSI) | over 100,000 | 35,000 | 45,000 |
| Tensile Modulus (PSI) | over 5 × 10⁶ | 500,000 | 800,000 |
| CTE (PPM/°C.) | Controllable −5 to +5 | 20 | 17 |
| Maximum Use Temperature (°C.) | Over 400 | 300 | 150 |

*Kaptan brand poly(maleimide), E. I. duPont de Nemours and Co.
**Mylar brand poly(ethylene terephthlate), E. I. duPont de Nemours and Co.

With respect to the fiber properties, it will be observed that the axial CTE value for PBZT is negative, as desired, and as is such value for Kevlar brand fiber. Much improved, however, is the modulus of the PBZT fiber compared to the other two materials set forth above. It is such improved high modulus in combination with the negative CTE which makes the PBZT fiber valuable as a reinforcement in the manufacture of PWBs. With respect to the film properties, it will be observed that the PBZT film is the only material set forth in the table which has a controllable CTE which is very low, and even can be controlled to be negative. It's high temperature usage, tensile strength and modulus also contribute to its utility as a reinforcement in PBWs.

As is evident from the foregoing tables, two useful forms for supplying PBZT for its use in PWB manufacture comprise yarns (composed of PBZT fibers) and continuous film form. With respect to fibers, such fibers generally will range in size from about 20 to 1,000 denier The fiber additionally can be subjected to stretch breaking as is conventional in the fabric art. The PBZT fiber may be fabric formed including plain woven fabric, twill fabric, satin weave fabric, basketweave fabric, and the like. In providing the PBZT as a fabric, its thin gauge means that the crimp factor (incidence of out-of-plane fibers) must be balanced with the fiber packing of the fabric. Such balancing can be accomlished by conventional fabric technology. The fabric can be woven from mono-filament or stretch broken filament of PBZT material only, or can be woven in combination with conventional reinforcing fiber, including, for examle, E glass, S glass, quartz fiber, Nextel brand inorganic fiber, organic fiber (e.g. Kevlar brand fiber or Nomex brand fiber), metal fiber, aluminum oxide or other ceramic fiber, and graphite fiber (though conductivity of the metal and graphite fibers must be accounted for). Further on conventional fibers can be found in *Handbook of Fillers and Reinforcements for Plastics,* edited by Katz and Milewski, Van Nostrand Reinholt Company, Litton Educational Publishing, Inc. (1978). The CTE of the multi-composite fabric can be tailored by choice of type and volume percentage of the conventional fiber utilized in addition to the PBZT fiber.

A second form for providing the PBZT reinforcement is in a continuous film, such as cast from polyphosphoric acid as taught in the references set forth above. The film can possess ostensibly uni-directional properties or can be made to possess biaxial orientation by stretch rolling techniques also set forth in the references cited above. The tensile strength of the continuous film tends to be less than the PBZT fiber form, though beneficial gains in improved volume packing make continuous film of 70-80 vol.-% and over reinforcement (in resin) per layer within manufacturing feasibility. For fabric, it will be recognized that about 40 vol.-% fabric content is a realistic maximum. It also may be possible to co-cast a PBZT film with another material, such as, for example, PBO or one of the other liquid crystalline polymers preferred for use in accordance with the precepts of the present invention, though such co-casting has not been implemented. PBZT film also may be formed with another material interspersed within its own matrix. This "resin infiltrated film" is useful for film to matrix adhesion promotion. PBZT film also allows the fabrication of single or multiconductor layer flexible circuits which have unique CTE properties. Not only can the resulting flexible circuits have in-plane linear CTE values matched to a variety of chip carrier substrates, but such circuits also can be used in such applications as space-based radar antenna structures where a 0 CTE is desirable.

A third form for supplying the PBZT material is in a non-woven sheet or mat formed from PBZT fibers, optionally containing heat-fusible binder. Paper-making technology has been applied to the manufacture of polymeric fiber-reinforced mats, as those skilled in the art will appreciate. Such technology additionally can be applied to use of PBZT fibers in mat formation. A heat-fusable (e.g. thermoplastic or thermoset) binder may be combined with the mat as is necessary, desirable, or convenient in conventional fashion. Mats formed from PBZT and another fiber also can be made from those fibers, such as set forth above. Such composite non-woven mats again enable the designer and manufacturer to tailor the properties of the resulting composite sheet, especially with respect to the CTE thereof. In fact, it may be possible to add discontinuous particulate reinforcement to the non-woven sheets and the PBZT fabric for gaining more flexibility in tailoring the CTE thereof. Such discontinuous particulate reinforcement includes, for example, PBZT itself, glass balloons, mica, quartz, beta-eucryptite, and the like. Again, additional discontinuous, particulate reinforcements, for example, include those found in *Handbook of Fillers and Reinforcement for Plastics,* supra.

Because of the negative CTE characteristic of PBZT material, the in-plane CTE of PBZT material-containing layers can be tailored to a desired value, for example 0–15 ppm/°C. A variety of techniques can be conceived for such CTE tailoring effort. Since MLPWBs utilize material for bonding the various laminates together, the PBZT layer, regardless of form, will be combined with a matrix or adhesive as typically are used in conventional MLPWB manufacture. Since typical matrices and adhesives will possess CTE values substantially higher than that desired, a simple manner for controlling the CTE of the resulting composite layer involves the selection of the type of matrix or adhesive used and the volumetric percentage of PBZT reinforcement contained in such layer. The CTE efficiency of the PBZT material enables less PBZT material to be utilized for achieving the desired CTE range of 0–15 ppm/°C.

Another technique which can be implemented for tailoring the CTE of the PBZT layer involves the utilization of alternative materials in association therewith. This has been described to an extent above with respect to combining other materials with PBZT in forming fabric and mats, for example. Additionally, PBZT layers can be alternated with layers manufactured from conventional reinforcing material in order to control the CTE of the resulting composite laminate. Such alternating layers can use conventional reinforcement, or can use combinations of conventional reinforcement and PBZT or other preferred material as disclosed herein.

Figure 2:
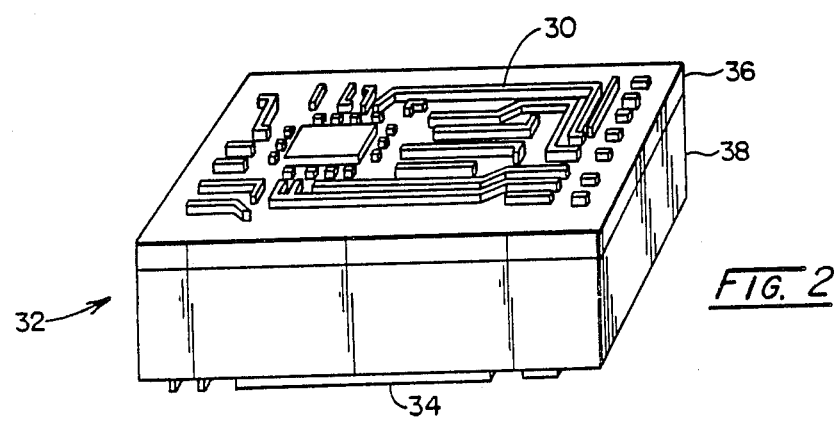
FIG. 2 is an enlarged perspective view of a laminate suitable for use in an MLPWB, such as in FIG. 1.

Referring to FIG. 1, an eight layer MLPWB can be constructed from the various laminates and bonding sheets depicted thereat. Laminates 10, 12, 14, and 16 have conductive circuits layered on both sides thereof, thus an eight conductor layer PWB. Interposed between the laminates are bonding sheets 18–28, with two bonding sheets being interposed between each laminate. It will be appreciated that the number of bonding sheets can be as low as one and can be as high as four or more. The bonding sheets, the laminates, or just one or more of the bonding sheets or laminates can be constrcted from PBZT, as described above. FIG. 2 is an enlarged perspective view of one of the laminate layers which suitably can be used in board construction as set forth at FIG. 1. Laminate 32 may range in dielectric thickness from about 1 to 250 mils. Again, appropriate artwork results in the conductive layer represented at 30 on the upper side of laminate 32 and circuitry 34 on the bottom side thereof. It will be appreciated that the conductive layer can be any suitable conductive material, which most often is copper, though other metal or conductive non-metal may be used. The metal foil or conductive layer preferably is copper in all of its forms including, for example, rolled, annealed, or electro-deposited, optionally with its surface treated with an oxide or other treatment. Application of the artwork also is conventional, as described below in more detail. Inventive laminate 32 has upper non-woven PBZT mat 36 supporting conductive circuitry 30. Interposed between mat 36 and circuitry 34 is PBZT/resin layer 38. The configuration of laminate 32 may find use as an outer layer of the board wherein mat 36 provides surface microfacture control while fabric layer 38 provides surface layer internal constraint. By design choice of materials and concentration of materials, the in-plane linear CTE of laminate 32 can be precisely controlled. It may be observed that layers 36 and 38 need not be of the same material of construction, such as described above. That is, either layer 36 or 38 may be manufactured from PBZT in combination with one or more conventional reinforcements and/or one of the layers can be entirely manufactured from conventional material.

Figure 3:
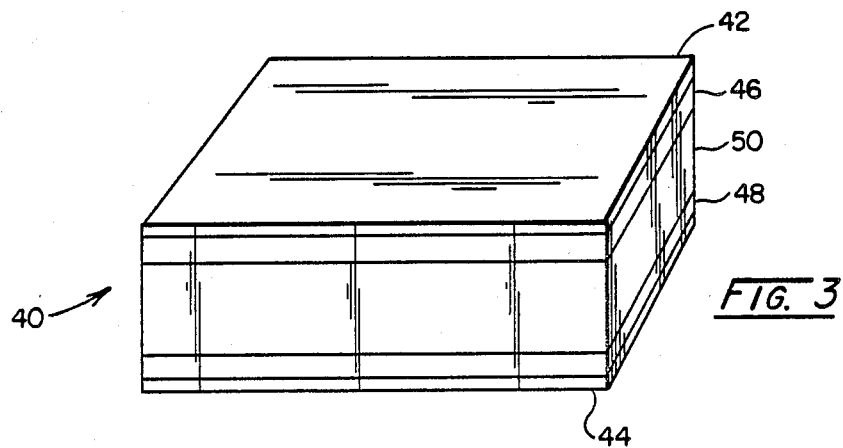
FIG. 3 is an enlarged perspective view of an un-etched laminate suitable for use in an MLPWB, such as in FIG. 1.

FIG. 3 sets forth yet another embodiment for laminate construction in accordance with the precepts of the present invention. Laminate 40 is shown in its pre-etched form to contain upper conductive layer 42 and lower conductive layer 44. The mode of manufacturing appropriate for laminate 40 comprehends the application of appropriate artwork to conductive layers 42 and 44 with unwanted areas being etched away in conventional fashion. Supporting conductive layers 42 and 44 are PBZT bi-directional films 46 and 48, respectively. Sandwiched therebetween is layer 50 which suitably can be manufactured from conventional material, such as E-glass, quartz, or like fiber in a conventional resinous matrix. Of course, layer 50 also could be manufactured to contain only PBZT, or a combination of PBZT and one or more conventional reinforcing fillers. Again, the unique configuration of laminate 40 permits the precise control of in-plane CTE thereof, as well as control of other laminate characteristics.

Figure 4:
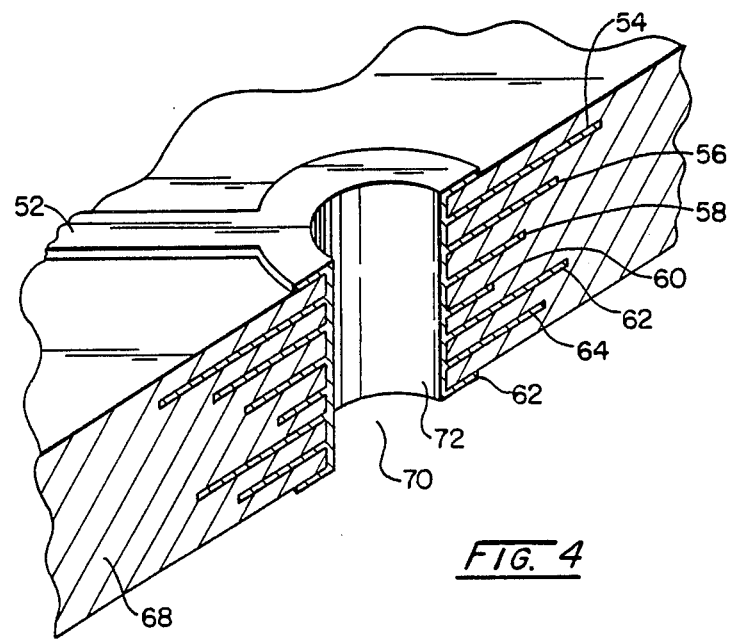
FIG. 4 is a partial perspective section of a plated-through hole (PTH) of an MLPWB, such as can be formed as shown in FIG. 1.

In FIG. 4, a conventional eight layer MLPWB is set forth in cross-sectional elevational view. It will be observed that upper conductive layer 52 is followed by conductive layers 56–64, and finally lower conductive layer 66. The reinforced dielectric matrix bearing the noted conductive layers is merely represented as 68, though it will be appreciated that a homogeneous composition throughout is not a limitation on the laminate set forth at FIG. 4 nor on the present invention. In order to interconnect the various circuit layers, hole 70 is drilled and etched through the laminate. Thereafter, copper or other conductive layer 72 is plated through the walls of hole 70 in conventional fashion. PBZT reinforcement is designed to minimize micro-cracking which occurs immediately adjacent conductive barrel 72 and in between each conductive layer at such intersection. Aspect ratios from PTH or via 70 often range from about 1:1 to 1:10 (diameter to heighth) in accordance with modern MLPWB technology.

A variety of MLPWBs utilize metal core layers such as copper-clad Invar metal (a high nickel-containing ferronickel alloy), Alloy 42, or like low-expansion metal. A unique achievement of the present invention involves the utilization of a polymer core layer as a replacement for conventional metal core layers. The outstanding properties of PBZT layers permit such replacement to be accomplished while maintaining the advantageous properties heretofore only achievable by utilizing metal core layers. The utilization of PBZT core layers permits the design of different electrical and physical characteristics of the board to be achieved. Of course, replacement of all metal core layers is not necessary, as the polymer core concept of the present invention in its broadest aspects comprehends the at least partial replacement of conventional metal cores, though entire replacement also is achievable. For example, the use of a metal backing plate for heat dissipation certainly may be practiced in the manufacture of the inventive PBWs of the present invention. Several embodiments of the inventive polymeric core layer embodiment of the present invention readily can be envisioned. With respect to the MLPWB set forth at FIG. 1, one embodiment calls for laminates 10–16 to be manufactured from conventional fiber reinforced laminates with bonding sheets 18–28 being manufactured from PBZT-reinforced matrix material. In another version, laminates 10–16 will contain PBZT reinforcement while the bonding sheets will be of conventional material. Yet another version calls for laminates 10–16 to be a composite structure such as laminate 32 of FIG. 2. Bonding sheets 18–28, then either can be conventional or PBZT-containing. In fact, bonding sheets 18–28 do not all have to be of the same composition. It will be observed that enormous flexibility in tailoring the CTE of the MLPWB is provided by the core layer embodiment of the present invention.

Resins or matrix materials utilized can be conventional or unconventional. Conventional resinous materials include, for example, ABS-containing resinous materials (ABS/PC, ABS/polysulfone, ABS/PVC), acetals, acrylics, alkyds, allylic ethers, cellulosic esters, chlorinated polyalkylene ethers, cyanate/cyanamides, epoxies and modified epoxies, furans, melamine-formaldehydes, ureaformaldehydes, phenolic resins, poly(bis-maleimides), polyalkylene ethers, polyamides (nylons), polyarylene ethers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, acetylene-terminated BPA resins, polyether ether imides, IPN polymers, triazine resins, and the like and mixtures thereof. It will be appreciated that specially-designed high performance resins for PWBs are available and are being developed by the industry.

Board processing utilizing PBZT, PBO, and like preferred materials of the present invention typically can be practiced in conventional fashion. Thus, appropriate use of B-stage resins with PBZT reinforcement can be practiced as well as use of C-stage laminates in final board lay-up. Registation formation of PTHs or vias also is practiced in conventional fashion. In fact, use of blind or buried vias also can be implemented utilizing PBZT-reinforced PWBs. It should be noted, that a unique processing development was evolved for utilizing non-woven PBZT mats. Such mats were found to be fragile and subject to difficulty in handling on occasion. In the manufacture of laminate 32 of FIG. 2, it was found convenient to utilize a non-woven mat of PBZT fibers as layer 36. Layer 38 was PBZT and conventional B-stage resin. The conductive layer that was etched to form circuitry 30 had a layer of resin applied thereto which resinous layer was placed in juxtaposition with the PBZT mat. During the temperature/pressure processing required to form laminate 32, the resinous layer (and presumably resin from layer 38) flowed through the mat to form layer 36. Layer 36 of the resulting laminate exhibited a continuous resinous matrix bearing PBZT fibers. All conventional and non-conventional methods of placing and defining the metallic or conductive layers on internal and external printed wiring board layers are encompassed by the present invention. Current conventional methods include, for example, additive, subtractive, and semi-additive process classifications. Also included are combinations of these process classifications to yield single side or multi-layer PWBs such as shown in FIG. 1.

The following examples show how the present invention has been practiced, but should not be construed as limiting. In this application, all citations are expressly incorporated herein by reference.

EXAMPLES

Example 1

The 155 coupon test vehicle consisted of three boards each measuring 3.25 in. × 3.5 in. and ranging from about 0.6 to 0.72 in. thick. Each eight-layered board was constructed in the configuration set forth at FIG. 1, except that only one bonding sheet was interposed between each laminate. Each laminate was manufactured from PBZT fabric plain woven from 1,000 denier PBZT mono-filament fiber. The matrix for the PBZT fabric was a blend of bismaleimide-triazene/epoxy resin (Epon 1123, Dow Chemical Company) in a weight ratio of 70/30, respectively. Each laminate contained about 60 vol-% resin and appeared to be resin-starved. The artwork used was MIL-STD-2750 pattern (modified). In-plane CTE measurements were taken over the temperature range of interest, −65° C. to +125° C. The boards were found to have a linear in-plane CTE of 1.55 ppm/°C. in the x direction and 0.24 ppm/°C. in the y direction.

Upon repeated thermal cycling (200 cycles) over the range of −65° to +125° C., electrically open PTHs and other failure modes were observed. These failure modes are attributed to the resin starvation exhibited by the PBZT laminates. The resin starvation of the laminates, in turn, is attributed to the rather large size fibers used in weaving the PBZT fabric. It is expected that with lower denier fibers, resin starvation will not be a problem, nor will the failure modes exhibited by the 155 coupon test board. Nevertheless, this example does demonstrate that PWBs of very low CTE can be manufactured in accordance with the precepts of the present invention.

Example 2

Another eight-layer PBZT board was manufactured from 1,000 denier plain weave fabric (0.008 in. thick). Each laminate was clad on both sides with one ounce of class 3 copper foil (0.0015 in. thickness) with the intermediate PBZT C-stage bismaleimide-triazine/epoxy matrix (see Example 1). A single bonding layer was interposed between each of the four laminates. Each bonding layer consisted of 1,000 denier plain weave PBZT fabric and the bismaleimide-triazine/epoxy matrix (0.059 in. thick). The resulting board had a nominal thickness of 0.685 in. unclad and 0.072 in. clad. In-plane measurements (strain gauge) and out-of-plane measurements (thermomechanical analysis) were conducted. The aluminum calibration in the strain gauge study yielded a value of about 21.3. A sample probe reading before the tests was 26.2 and after the tests it was 25.5. These readings confirm the consistency of the probe readings during the tests. Thermomechanical analysis (TMA) utilized a "macro-expansion" probe with a 1 g. weight and a sample heating rate of 10° C./per minute was used. Both runs are reported since the first run scans behaved well and give an indication of board expansion behavior during an initial thermal transient. The following data was recorded:

TABLE 1

| Sample No. | In-Plane (PPM/°C.)* | | | | | Out-of-Plane** | | | | | |
| | | | | | | Run 1 | | | Run 2 | | |
| | 0° | 45° | 90° | −45° | Avg. | $\alpha 1$ | Tg | $\alpha 2$ | $\alpha 1$ | Tg | $\alpha 2$ |
| 1 | 2.2 | 1.4 | 1.8 | 1.1 | 1.6 | 73 | — | — | 33 | 131° | 233 |
| 2 | 3.1 | 2.7 | 0.0 | 3.3 | 2.0 | 53 | 114 | 349 | 20 | 127° | 249 |
| Avg. | 2.6 | 2.0 | 0.9 | 2.2 | 1.8 | — | — | — | — | — | — |

*° = Long dimension of board = Transverse fabric (fill) direction
**$\alpha 1$ = Linear CTE average from −65° to +125° C. (below Tg) in ppm/°C.
Tg = Glass Transition temperature determination by TMA (°C.)
$\alpha 2$ = Linear CTE value at 200° C. (above Tg) in ppm/°C.

The above-tabulated data shows the desired low in-plane CTE values which are obtained utilizing PBZT-reinforced MLPWBs, thus enabling board designs raising the CTE values to a desired level of between 3 and 7 ppm/°C. The artwork used on the board was a modified IPC-A-48 artwork (The Institute for Interconnecting and Packaging Electronic Circuits, Evanston, Ill.).

Example 3

Another eight-layer board was manufactured as in Example 2, except that two bonding sheets per layer were utilized. Also, each laminate had the construction as set forth at FIG. 2 utilizing one ounce of class 3 copper foil (0.0015 in.) on either side with a 0.3 ounce of PBZT mat (0.001 in.) underneath the top foil layer followed by the PBZT C-stage layer as described in Example 2. The laminate was manufactured utilizing the technique wherein the B-stage resin was applied to the underneath side of the copper foil and a non-resinous dry mat of PBZ fibers was used. Again, modified IPC-A-48 artwork was used. Measurements were taken in the manner as described in connection with Example 2.

TABLE 2

| Sample No. | In-Plane (PPM/°C.)* | | | | | Out-of-Plane** | | | | | |
| | | | | | | Run 1 | | | Run 2 | | |
| | 0° | 45° | 90° | −45° | Avg. | 1 | Tg | 2 | 1 | Tg | 2 |
| 3 | 1.5 | 0.6 | 1.3 | 1.3 | 1.9 | 56 | 143° | 322 | 41 | 134° | 254 |
| 4 | 1.2 | 3.4 | 0.1 | 1.4 | 1.3 | 77 | 121° | 269 | 61 | 130° | 288 |
| 5 | — | — | — | — | — | 80 | 112° | 302 | 54 | 192° | 250 |

TABLE 2-continued

| Sample No. | In-Plane (PPM/°C.)* | | | | | Out-of-Plane** | | | | | |
| --- | --- | --- | --- | --- | --- | --- | --- | --- | --- | --- | --- |
| | | | | | | | Run 1 | | | Run 2 | |
| | 0° | 45° | 90° | −45° | Avg. | 1 | Tg | 2 | 1 | Tg | 2 |
| Avg. | 1.3 | 2.0 | 0.7 | 1.4 | 1.7 | — | — | — | — | — | |
| #3 with Cu | 7.1 | — | 0.0 | — | — | | | | | | |

Again, the above-tabulated data shows the excellent low CTE values which are achieved utilizing PBZT reinforcement. Again, tailoring of higher CTE values is possible therebecause.

Example 4

Several boards were made in accordance with the polymer core layer embodiment of the present invention using only a portion of the IPC-A-48 artwork pattern which was repeated over the boards. Each of the four laminates were RO2800 fluoropolymer composite laminates manufactured by Rogers Corporation (Chandler, Ariz.). The laminate data sheets reveal the following: $E_r=2.9$ (measured at 10 GHz), a dissipation factor of 0.0012, a CTE of 16 in the x-y plane and 24 in the z plane (ppm/°C.), and a tensile modulus of 0.12 Mpsi. Each laminate was 2.5 mils thick and had one ounce of copper foil applied to each side thereof. One set of boards utilized Kevlar 108 brand reinforcement (poly-p-phenylene terephthalamide fibers, CTE=−5 ppm/°C., tensile modulus=18.5 MPSI, E. I. DuPont de Nemours and Company). The matrix material was Quatrex brand epoxy resin (Dow Chemical Company) reported to have the following physical characteristics: $T_g=180°$ C., Z-axis expansion=48 ppm in./in.2°C., copper peel of 9 lbs/in., and curable at 177° C. for 90 minutes. Each bonding sheet was 2 mils thick. A second set of boards utilized the 8 mil thick PBZT fabric layers of Example 2. The number of bonding sheets per layer was varied for each set of boards manufactured. The following data (two independent readings per sample) was recorded.

TABLE 3

| Sample | Reinforcement | Board Thickness (in.) | CTE (ppm/°C.) X-Plane | Y-Plane |
| --- | --- | --- | --- | --- |
| 10 | Kevlar-2 Bonding Sheets per layer | 0.0325 | 11.6 | 12.84 |
| | | | 11.2 | 12.9 |
| 11 | Kevlar-3 Bonding Sheets per layer | 0.0374 | 10.52 | 12.52 |
| | | | 9.73 | 11.2 |
| 12 | Kevlar-4 Bonding Sheets per layer | 0.0423 | 10.54 | 11.17 |
| | | | 11.96 | 11.43 |
| 13 | PBZT-1 Bonding Sheet per layer | 0.0422 | 7.10 | 3.69 |
| | | | 6.8 | 5.0 |
| 14 | PBZT-2 Bonding Sheets per layer | 0.0595 | 2.23 | 0.98 |
| | | | 1.8 | 0.8 |
| 15 | PBZT-3 Bonding Sheets per layer | 0.0735 | 2.22 | −0.35 |
| | | | 1.4 | 0.7 |

Comparative Samples 10–12 exhibit CTE values greater than the target of 3–7 ppm/°C. Inventive Samples 13–15 exhibit CTE values lower than desired, though increasing the CTE values should be readily possible. Samples 13–15 demonstrate that the polymeric core layer embodiment of the present invention is viable. Advantages of this approach include the ability to use conventional process steps and lamination temperatures. This means that such approach is more readily implementable in present commercial manufacturing settings.

We claim:

1. In a multi-layer printed wiring board (MLPWB) made from laminates with bonding sheets therebetween, the improvement which comprises at least one layer thereof formed from a liquid crystalline polymer selected from the group consisting of poly(para-phenylene benzobisthiazole), poly(para-phenylene benzobisoxazole), poly(2,5-benzothiazole), poly(2,5-benzoxazole), and mixtures thereof.

2. The MLPWB of claim 1 wherein both the laminates and the bonding sheets are formed from a layer which is formed from said liquid crystal polymer.

3. The MLPWB of claim 1 wherein only said laminates are formed from said liquid crystal polymer.

4. The MLPWB of claim 1 wherein only said bonding sheets are formed from said liquid crystal polymer.

5. The MLPWB of claim 1 wherein the reinforcement of said laminates partially comprises said liquid crystal polymer.

6. The MLPWB of claim 1 wherein said bonding sheets partially comprise said liquid crystal polymer.

7. The MLPWB of claim 1 wherein said liquid crystal polymer content is in the form of fabric, non-woven mat, continuous film, yarn, pulp, and particulates.

8. The MLPWB of claim 1 wherein said laminate reinforcing layers comprise alternating layers, only some of which comprise said liquid crystal polymer.

9. The MLPWB of claim 1 which contains an in-plane coefficient of thermal expansion ranging from between about 0 and about 15 ppm/°C.

10. The MLPWB of claim 1 wherein said liquid crystal polymer comprises poly(para-phenylene benzobisthiazole).

11. A laminate for use in manufacturing a printed wiring board (PWB) which comprises two outer conductive layers having interposed therebetween a resinous bonding layer bearing a liquid crystal polymer reinforcement selected from the group consisting of poly(para-phenylene benzobisthiazole), poly(para-phenylene benzobisoxazole), poly(2,5-benzothiazole), and poly(2,5-benzoxazole).

12. The laminate of claim 11 wherein said liquid crystal polymer reinforcement comprises poly(para-phenylene benzobisthiazole).

13. The laminate of claim 11 wherein said liquid crystal polymer reinforcement is in the form of fabric, non-woven mat, or continuous film.

14. The laminate of claim 13 wherein a combination of said forms are used in forming said laminate.

15. The laminate of claim 11 wherein said conductive layers comprise reinforced laminates at least one of which comprises said liquid crystal polymer reinforcement.

16. The laminate of claim 11 wherein said conductive layers are manufactured from copper.

17. In the construction of a multi-layer printed wiring board (MLPWB), a method for controlling the in-plane linear coefficient of thermal expansion (CTE) thereof which comprises forming at least one layer of said MLPWB from a liquid crystal polymer selected from the group consisting of poly(para-phenylene benzobisthiazole), poly(para-phenylene benzobisoxazole), poly(2,5-benzothiazole), poly(2,5-benzoxazole), and mixtures thereof.

18. The method of claim 17 wherein said CTE is controlled to range from about 0 to about 15 ppm/°C.

19. The method of claim 17 wherein said layer is formed from a heat-fusible resin and said liquid crystal polymer.

20. The method of claim 17 wherein said liquid crystal polymer comprises poly(paraphenylene benzobisthiazole).

21. The method of claim 17 wherein a laminate of said MLPWB comprises two outer conductive layers having interposed therebetween said liquid crystal polymer layer.

22. The method of claim 21 wherein said laminate partially comprises said liquid crystal polymer.

23. The method of claim 17 wherein at least one bonding layer interposed between the laminates of said MLPWB is formed from said liquid crystal polymer.

24. The method of claim 23 wherein at least one bonding sheet of said MLPWB partially comprises said liquid crystal polymer.

25. The method of claim 17 wherein said liquid crystal polymer is supplied in the form of a fabric, a nonwoven mat, or a continuous film.

26. The method of claim 25 wherein a combination of forms is used.

27. The method of claim 17 wherein said liquid crystal polymer is in the form of yarn, particulates, or pulp.

* * * * *